United States Patent [19]

Boyd et al.

[11] Patent Number: 5,516,710
[45] Date of Patent: May 14, 1996

[54] METHOD OF FORMING A TRANSISTOR

[75] Inventors: John M. Boyd, Woodlawn; Joseph P. Ellul; Sing P. Tay, both of Nepean, all of Canada

[73] Assignee: Northern Telecom Limited, Montreal, Canada

[21] Appl. No.: 339,184

[22] Filed: Nov. 10, 1994

[51] Int. Cl.$^6$ .............................................. H01L 21/265
[52] U.S. Cl. ............................ 437/31; 437/203; 437/228
[58] Field of Search .............................. 437/31, 32, 59, 437/912, 228, 203; 148/DIG. 11, DIG. 104

[56] References Cited

U.S. PATENT DOCUMENTS

| | | | |
|---|---|---|---|
| 4,440,804 | 4/1984 | Milgram | 437/203 |
| 4,774,204 | 9/1988 | Havemann | 437/54 |
| 4,892,835 | 1/1990 | Rabinzohn et al. | 437/912 |
| 4,983,531 | 1/1991 | Cosentino | 437/31 |
| 4,996,581 | 2/1991 | Hamasaki | 357/34 |
| 5,034,351 | 7/1991 | Sun et al. | 437/228 |
| 5,064,774 | 11/1991 | Pfiester | 427/31 |
| 5,155,053 | 10/1992 | Atkinson | 437/203 |
| 5,194,926 | 3/1993 | Hayden | 257/565 |
| 5,286,661 | 2/1994 | Fresart et al. | 437/31 |
| 5,288,660 | 2/1994 | Hua et al. | 437/912 |
| 5,302,535 | 4/1994 | Imai et al. | 437/31 |
| 5,320,972 | 6/1994 | Wylie | 437/31 |

FOREIGN PATENT DOCUMENTS

| | | | |
|---|---|---|---|
| 0024465 | 1/1989 | Japan | 437/912 |
| 0018037 | 1/1991 | Japan | 437/912 |

OTHER PUBLICATIONS

J. H. Comfort et al "Profile leverage in a self–aligned epitaxial Si or SiGe Base Bipolar Technology" 1990 IEEE IEDM 90–21, p. 2.4.1.

"A High Speed Bipolar LSI Process Using Self–Aligned Double Diffusion Polysilicon Technology" K. Kikuchi et al IEDM Abstracts p. 420, 1986.

"Sub–30ps ECL Circuits Using High–fr Si and SiGe Epitaxial Base SEEW Transistors" J. N. Burghartz et al 1990 IEEE IEDM 90–297 pp. 12.1.1–12.1.4.

"A Sub–30psec Si Bipolar LSI Technology" T. Gomi et al 1988 IEEE IEDM 88 pp. 744–747.

*Primary Examiner*—Tuan H. Nguyen
*Attorney, Agent, or Firm*—Angela C. de Wilton

[57] ABSTRACT

A method is provided for forming a transistor for a bipolar, CMOS, or bipolar CMOS integrated circuit. The method is applicable to forming a double polysilicon self-aligned bipolar transistor using a single masking step for defining the emitter structure with a narrow emitter-base contact area and a large emitter contact area. The method comprises selectively providing a tapered body of dielectric to mask a region of the substrate on which an emitter is to be formed. A conductive layer is provided around the tapered body to form base contact electrodes. The tapered body is selectively removed from the substrate without damaging the underlying silicon substrate, to leave a tapered opening; localized dielectric isolation is provided in the form of sidewall spacers on the first conductive layer. The tapered opening is filled with a layer of a second conductive material to form a second electrode i.e. an emitter structure. The resulting structure is fully planarized, preferably by chemical mechanical polishing, to form coplanar contact areas to the base and emitter.

17 Claims, 7 Drawing Sheets

METHOD OF FORMING A TRANSISTOR

FIELD OF THE INVENTION

This invention relates to a transistor structure and a method of forming a transistor structure, with particular application to formation of bipolar and CMOS integrated circuits.

BACKGROUND OF THE INVENTION

In fabrication of bipolar transistors for silicon integrated circuits, formation of both the base and emitter electrodes from polysilicon allows for reduced collector-base overlap area, and reduces collector-base parasitic capacitances.

In known processes for formation of a polysilicon emitter structure for a bipolar transistor, the process steps typically involve formation of a device well in a silicon semiconductor substrate, and formation of an intrinsic base region therein; deposition of first layer of polysilicon (base poly) to form extrinsic base contact electrodes; patterning and opening of an emitter window in the first (base) polysilicon layer; forming local isolation in the form of sidewall spacers within the opening; and, formation of a second polysilicon layer within the emitter window to form an emitter structure.

However, there are several problems in this approach. First, the step of photolithographic patterning and etching the emitter window in polysilicon material deposited on a single crystal silicon substrate results in etch damage to the exposed device well region when the substrate is over-etched, because the etch rate of polysilicon relative to crystalline in known etch processes is comparable. Thus etching of polysilicon on a crystalline silicon substrate is not highly selective. Since some overetching of the substrate is practically unavoidable to provide a manufacturable process, the resulting etch damage to the silicon of the substrate contributes to degraded device performance. Second, two masking layers are required to define the emitter structure, one for patterning the emitter window and one for defining the polysilicon emitter structure. Further masking steps may be required for defining an area of increased doping in the base contact area, to reduce base contact resistance. Additionally, the resulting topography is highly non-planar, which complicates subsequent photoengraving and metallization steps for providing contacts to the base and emitter electrodes.

A number of schemes have been proposed to alleviate these problems. For example, as described in an article by J. H. Comfort et al., entitled "Profile leverage in a self-aligned epitaxial Si or SiGe Base Bipolar Technology" 1990 IEEE IEDM 90-21, p. 2.4.1, and another article by E. Ganin et al., entitled "Epitaxial base, double poly self-aligned bipolar transistors", page 24.6.1 of the same reference, selective epitaxial overgrowth is used to form a self-aligned epitaxial base, either in an epitaxy-after-sidewall approach or an epitaxy-before-sidewall approach. Alternatively, selective epitaxy may be used in a self-aligned emitter to base process in which an emitter window is defined by using an in-situ doped epitaxial lateral overgrowth over a patterned thin oxide/nitride pad.

In another scheme, as described in an article entitled "A high speed bipolar LSI process using self-aligned double diffusion polysilicon technology", by K. Kikuchi et al., IEDM abstracts p.420, 1986, a self-aligned process comprises masking the emitter diffusion window with a CVD oxide pattern before forming the first polysilicon base electrodes, then removing the oxide pattern and forming the emitter structure by deposition and patterning of a second polysilicon layer.

Another approach is described in U.S. Pat. No. 5,320,972 to Wylie entitled "Method of forming a bipolar transistor" which describes a self aligned single polysilicon bipolar transistor.

While other processes for formation of bipolar transistors are known, it is desirable for bipolar CMOS integrated circuits that a process for forming a bipolar transistor should be compatible with conventional known silicon technology for CMOS processes, so that optimal performance of both bipolar and CMOS devices can be achieved without unduly adding to the overall number of process steps and process complexity, and with a minimum number of additional mask levels.

SUMMARY OF THE INVENTION

The present invention seeks to provide a transistor structure and a method of forming a transistor structure, in which the above mentioned problems are avoided or reduced.

According to one aspect of the present invention, there is provided a method of forming a transistor for an integrated circuit, comprising:

providing a semiconductor substrate for an integrated circuit having a surface with a device well region of a first conductivity type defined therein;

providing a tapered body of a first dielectric material masking a selected region of the substrate surface, the tapered body having sidewalls tapering outwardly from the selected region on the substrate towards a top surface of the tapered body;

providing a layer of an other dielectric material forming sidewall spacers on sidewalls of the tapered body;

providing a layer of a first conductive material over regions of the substrate adjacent the tapered body, said layer having a surface coplanar with the top surface of the tapered body, to form first contact electrodes with the underlying substrate surface;

selectively removing the tapered body of the first dielectric material from the substrate thereby exposing sidewall spacers of %he ocher dielectric material co define a tapered opening exposing said selected region of the substrate within the opening;

forming a second contact electrode by providing a layer of a second conductive material within the tapered opening, isolated from the first conductive layer by the dielectric sidewall spacers;

planarizing the resulting structure to form a fully planarized surface providing coplanar contact areas on the first and second contact electrodes.

Thus the method provides transistor structures which can be integrated into bipolar or MOS transistors. The method masks a selected region of the device well region of the substrate, by a tapered body of a first material, during formation of the first conductive layer. The first conductive layer forms the contact electrodes to the substrate surrounding the selected region, i.e. to base contact regions of a bipolar transistor (or correspondingly to the source/drain regions of a MOS field effect transistor). Subsequently when the tapered body of dielectric is removed, a tapered opening remains, exposing the underlying substrate. A second electrode is formed in the tapered opening, i.e. to form a bipolar emitter structure or MOS gate electrode, after providing sidewall spacers isolating the first and second conductive layers. The tapered form of the resulting second electrode allows for minimization of the bipolar emitter-base junction, or MOS gate-width, while providing a conveniently large area for forming contact metallization by known processes.

Advantageously, full planarization of the resulting structure by chemical mechanical polishing, at one or more stages of processing, provides for coplanar contact areas to both the first and second conductive electrodes. Subsequent metallization steps are thus simplified.

The tapered body is provided by masking the substrate with a layer of dielectric, etching therein a tapered opening to expose a selected region of the substrate, depositing another dielectric within the opening, and selectively removing the masking layer. The tapered opening is provided by a combination of anisotropic and isotropic etch processes. Thus for example if the masking layer is a low density oxide, the tapered body may comprise silicon nitride to provide etch selectivity.

Consequently, the process is advantageous in that known methods for etching dielectrics relative to the underlying silicon substrate are highly selective. Thus etching of the first masking layer to define the tapered opening in the junction region, and subsequently, removal of the tapered body of dielectric material may be performed with high selectivity and avoids damage to the silicon substrate in an underlying intrinsic base region or channel region.

According to another aspect of the present invention there is provided a method of forming a bipolar transistor for an integrated circuit comprising:

providing a semiconductor substrate for an integrated circuit comprising a surface having defined therein a device well region of a first conductivity type;

providing a masking layer of a dielectric material overall;

patterning and etching the masking layer to define a tapered opening therethrough exposing a selected region of the substrate within a bottom of the tapered opening, said selected region defining a base-emitter junction area of the bipolar transistor;

providing a tapered body of a second dielectric material by filling the tapered opening coplanar with a surrounding surface of the masking layer;

selectively removing the masking layer, leaving exposed tapered sidewalls of the body of the second dielectric material, the tapered body of the second dielectric material thereby masking the selected region of the substrate;

providing a layer of a first conductive material over exposed regions of the substrate adjacent the tapered sidewalls of the dielectric body to form base contact electrodes with the underlying substrate;

selectively removing the tapered body of the second dielectric and exposing sidewalls of the first conductive layer to define a tapered emitter opening therein;

providing a dielectric isolation layer comprising sidewall spacers on exposed sidewalls of the first conductive layer;

forming an intrinsic base region of a second conductivity type within the opening;

forming an emitter structure within the emitter opening comprising of a layer of an emitter material of the first conductivity type filling the opening in the first conductive layer to a level coplanar with the planarized surface of the first conductive layer, the emitter material being isolated from the first conductive layer by the sidewall spacers and forming a base-emitter junction with the underlying base region within the opening.

Thus the method provides a process for forming a bipolar transistor in which only one masking level is required to form the emitter structure. Preferably, the masking layer is formed of a material which can be etched with high selectivity relative to the substrate of the device well region, to minimize etch damage to the intrinsic base region of substrate. For example when the substrate is single crystal silicon, the masking layer may be silicon dioxide, silicon nitride or other dielectric which may be selectively etched with etch selectivity of 10:1 or more relative to silicon.

Advantageously, the masking layer is formed by a process in which defines a wedge shaped plug, i.e. having tapered sidewalls, whereby the resulting emitter opening is tapered, i.e. broad at the top and narrowing towards the substrate. Thus after depositing the first conductive layer, etching back and removing the emitter masking plug, the sidewalls of the first conductive layer defining the emitter opening are tapered. After forming dielectric sidewall spacers thereon, a layer of emitter material is deposited to fill the opening. The structure is etched back and planarized, preferably by chemical mechanical polishing to provide a fully planarized surface. Thus the resulting base enclosed emitter structure is self aligned within the emitter opening, but the tapered shape provides sufficient contact area on the upper surface of the emitter structure for forming top contacts, while the area of base-emitter junction is reduced. The process avoids etching of the first conductive layer relative to the active base region of the substrate to form an emitter opening in the device well region. Where the first conductive layer forming the base contact is polysilicon, etching of polysilicon on a single crystal silicon substrate during patterning of the emitter window is avoided.

The avoidance of a non-selective etch of polysilicon relative to silicon is a major advantage for manufacturability and reliability, resulting in improved yields and device performance. Thus a self-aligned bipolar emitter-base junction is provided using a single lithographic step, in a reverse-emitter masking process.

The process is applicable for forming transistor structures for Bipolar, MOS, and Bipolar-MOS processes, particularly those requiring planar "front-end" processing. Other applications of the process include formation of a self-aligned MOS gate and raised source-drain structures for CMOS transistors, by defining the gate region using a corresponding reverse masking scheme.

According to another aspect of the present invention there is provided a transistor structure comprising:

a semiconductor substrate for an integrated circuit having a surface with a device well region of a first conductivity type defined therein;

heavily doped regions of a second conductivity type defined in surface of the device well defining an active region therebetween;

a tapered body of a first conductive material formed on the active region, the tapered body having sidewalls tapering outwardly away from the active region to a top surface of the tapered body and forming a first electrode;

a layer of an other conductive material formed on said heavily doped regions of the substrate adjacent the active region and surrounding the tapered body of the first conductive material, the other conductive material forming contact electrodes to said heavily doped regions of the substrate with the side walls of the first conductive material and the other conductive material being isolated from one another by an intervening layer of dielectric;

surfaces of the tapered body and the layer of other conductive material and the intervening dielectric layer being fully planarized to provide coplanar contact areas to the first and second conductive materials.

Thus a transistor is provided with a reduced emitter base junction width, with a larger area for formation of a contact, and coplanar contact areas to both first and second contact electrodes, i.e. the base and emitter electrodes of a bipolar transistor.

Thus a transistor structure is provided by a process including full planarization of the structure by CMP techniques, and which reduces the number of masking steps needed to achieve reduced dimensional emitter structures in a bipolar transistor structure by defining the final dimension with a sidewall spacer deposition and top contacts to an emitter base enclosed emitter may be made. The number of mask levels are reduced in complex analog BiCMOS integrated circuits.

Thus the present invention provides a transistor structure, and a method of forming a transistor structure in which the above mentioned problems are avoided or reduced.

BRIEF DESCRIPTION OF THE DRAWINGS

An embodiment of the invention will now be described by way of example, with reference to the accompanying drawings, in which.

DESCRIPTION OF THE PREFERRED EMBODIMENTS

Figure 1:
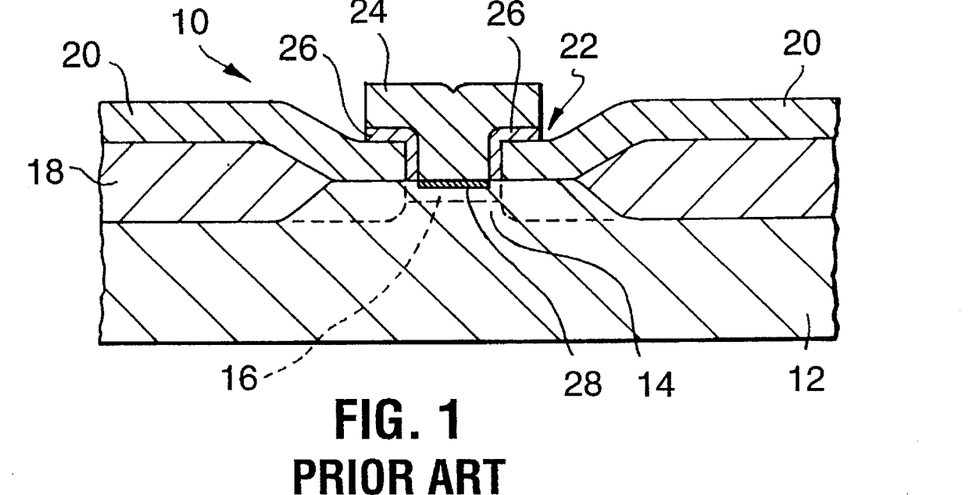
FIG. 1 shows a schematic cross-sectional view of part of an integrated circuit structure comprising a bipolar transistor formed according to a known conventional prior art method.
Figure 1A:
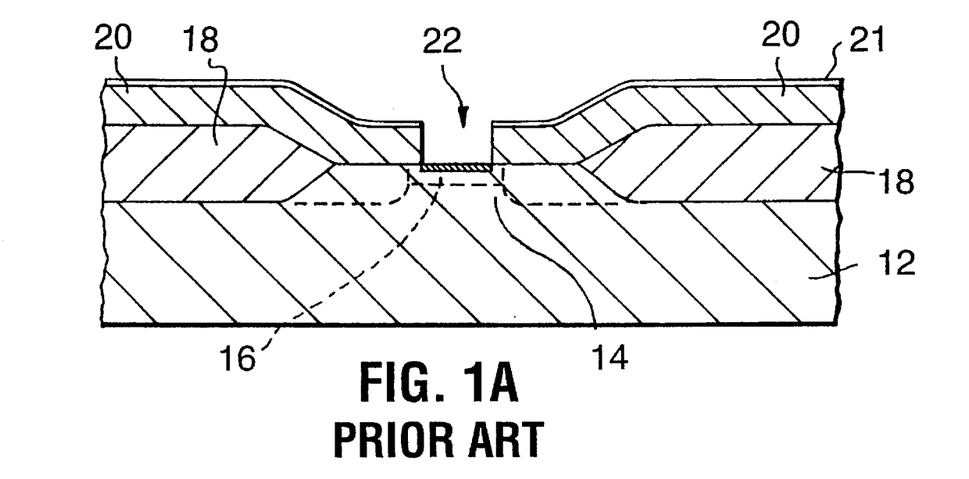
FIG. 1A shows a cross-sectional view during fabrication of the structure of FIG. 1.

A schematic cross-section through a bipolar transistor 10 formed by a conventional, prior art, double-polysilicon process is shown in FIG. 1, and comprises a substrate in the form of part of a silicon wafer 12 having formed therein a $N^+$ type device-well region 14 isolated by a field isolation layer 18 of silicon dioxide. A P doped intrinsic base region 16 is formed in the well region 14. A first layer 20 of polysilicon is deposited overall, including over the device-well region 14, and is patterned and etched to define an emitter opening 22 (FIG. 1A). The first polysilicon layer 20 is heavily P doped, either by in situ doping during deposition or by ion implantation, to form the base contact electrodes. A layer of dielectric e.g. CVD silicon dioxide is then deposited overall and etched to leave sidewall spacers 26 of oxide on exposed sidewalls of base polysilicon 20 surrounding the opening 22. A second polysilicon layer 24 is then deposited in the emitter opening on the intrinsic base region 16 to form an emitter-base junction 28 within the opening 22. The resulting topography of the second polysilicon layer forming the emitter structure is highly non-planar, as shown schematically in FIG. 1. Subsequent metallization steps, including contact formation to the first (base) and second (emitter) polysilicon layers, are provided by a conventional known method. As mentioned above, a problem arises in the step of etching the first polysilicon layer 20 to form the opening 22 defining the emitter base junction region 28 on the single silicon substrate 12 (FIG. 1A), because conventional etch processes are non-selective and may result in etch damage to the substrate surface in the base-emitter junction region 28 which degrades device performance and reliability.

Figure 2:
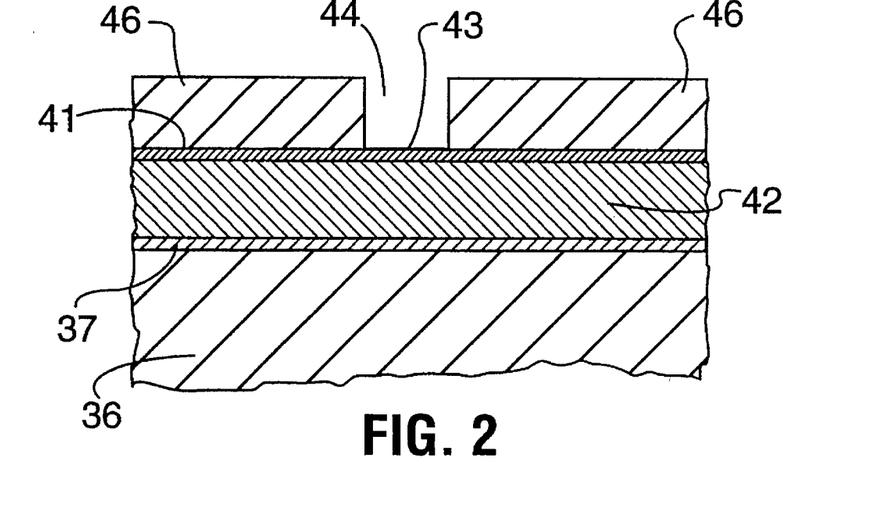
FIGS. 2, 2A, 3–7, 8–15, 17–19 show schematic cross-sectional views of part of an integrated circuit structure at successive stages in a method of forming a bipolar transistor according to an embodiment of the present invention.
Figure 2A:
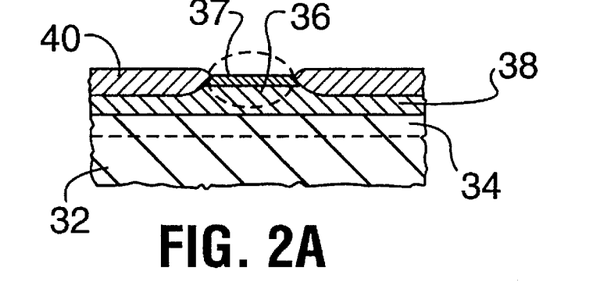

In a method of forming a bipolar transistor structure 30 for a Bipolar-CMOS integrated circuit o according to a first embodiment of the present invention (FIGS. 2 to 12) a substrate for an integrated circuit in the form of a semiconductor silicon wafer 32 is provided. A device well region 36 is formed in the substrate surface as shown in FIG. 2. The substrate surface region (FIG. 2a, inset) comprises for example, a heavily doped buried layer 34, i.e. a layer of As or Sb doped $N^+$ type silicon, overlaid by a 0.5 µm to 0.3 µm thick layer of epitaxial silicon 36 lightly doped with n type dopant, e.g. $5×10^{15}$ $cm^{-3}$ in which is formed a device- well region (FIG. 2). The layers 34 and 36 are formed by a conventional method, for example, by epitaxial growth, or alternatively by MeV ion implantation.

A conventional field isolation layer 40 is formed, for example by a known fully recessed field oxide process to reduce surface topography for subsequent processing.

Optionally, the dopant concentration is increased under the field oxide by the use of an N guard implant immediately prior to the field oxidation. Alternatively, a more heavily doped N well 38 is provided in the epitaxial layer 36 under the field oxide region 40, for example by implantation with N type ions at a dose in the $≠5×10^{16}$ $cm^{-3}$ range, this implant being excluded from a device well region 36 in which a bipolar transistor is to be formed. The more heavily doped N well concentration provides for increasing the "field threshold" for the parasitic field oxide MOSFET or to serve as an appropriate well for CMOS transistors on the same die.

The surface region of the device well 36 is selectively doped to form a base region 37. Then a sacrificial masking layer 42 is deposited overall (FIG. 2 shows the device well region only). The masking layer 42 comprises a material which can withstand subsequent process steps for forming a polysilicon emitter structure, as will be described. For example, a well known suitable masking material for layer 42 comprises a low density CVD silicon dioxide layer. The oxide layer 42 is deposited overall, but it is not densified, as is conventional, so that where the field isolation 40 is also silicon dioxide, the masking layer 42 is differentiated from the underlying field oxide layer 40 of silicon dioxide. Thus, plasma etching of the emitter masking oxide layer 42 can then be performed with at least 2:1 selectivity relative to the underlying field oxide 40 using a conventional dry etching process, that is a plasma etch or reactive ion etch process. Preferably, a hard masking layer 41, of SiN, BN or SiC, is provided on top of masking layer 40, for reasons to be explained below. The masking layers are patterned by a conventional photo-engraving step, to define a region for an emitter opening 44 (FIG. 2). That is, the wafer is coated with photoresist 46, and patterned to expose a region 43 of hard mask 41 and the masking layer 42 in the device well region.

Figure 3:
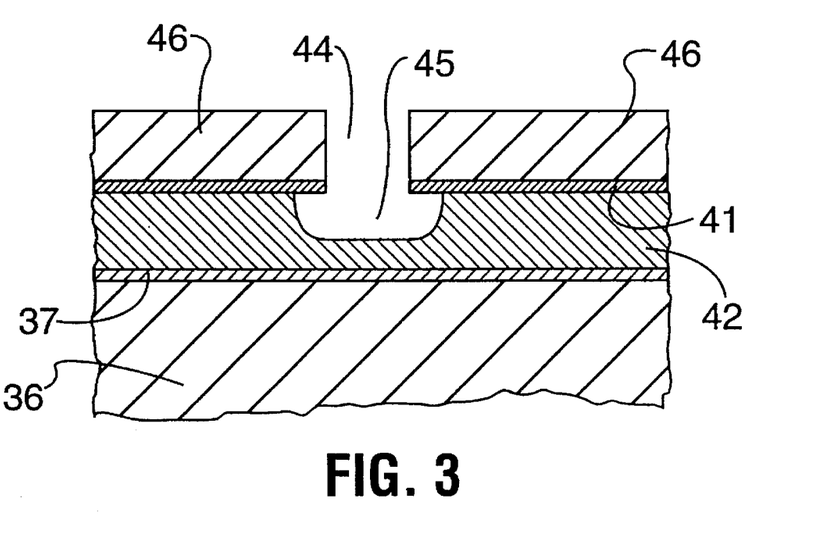
Figure 4:
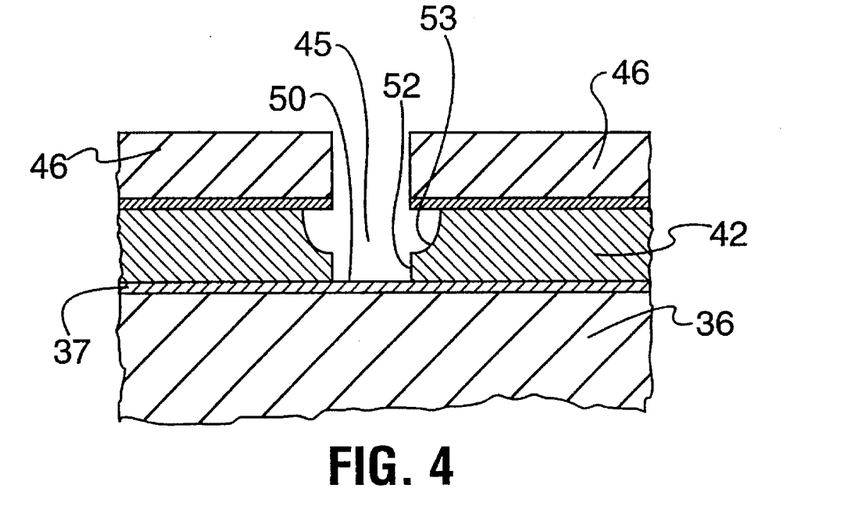
Figure 5:
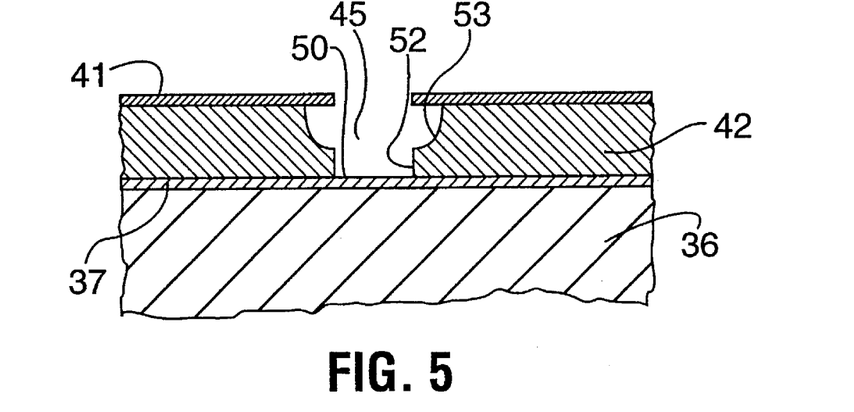

Advantageously, the process for etching the masking layer comprises a multi-stage etch comprising first removing the hard mask from the surface 43. The exposed region 43 of the surface then etched by a known isotropic process which undercuts the masking layer 41, to form part of an emitter opening 45, as shown in FIG. 3. An anisotropic etch which is selective to the underlying silicon etches vertically through the remaining thickness of the masking layer to expose the silicon surface 50 form the tapered emitter opening 45, and having steep sidewalls 52. Thus the resulting funnel shaped emitter opening 45 comprises an upper part 53 which is tapered outwards towards the surface.

Figure 6:
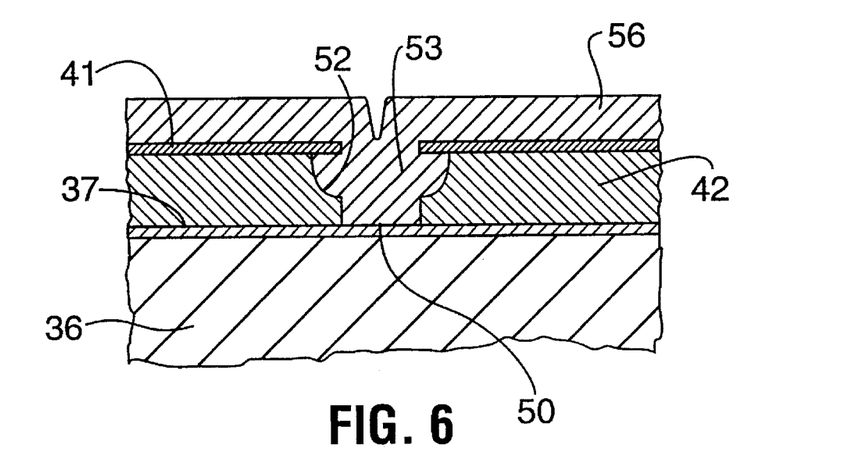
Figures 7, 7A:
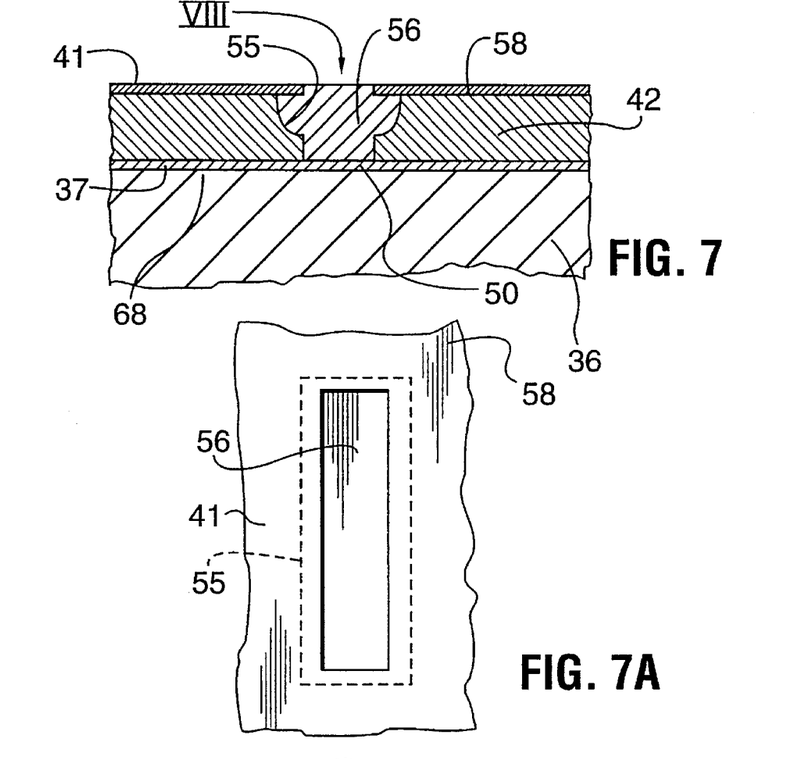
FIG. 7A shows a top view of the structure along arrow VIII in FIG. 7.

After stripping the resist 46 and leaving the hard masking layer 41 in place, a conformal layer 56 of a second dielectric material, is deposited overall, thereby lining the sidewalls 53,52 of the tapered emitter opening. The layer 56 is of a sufficient thickness to fill the emitter opening above the surface of the first dielectric (oxide) masking layer 42 (FIG. 6). The second dielectric layer 56 comprises for example, silicon nitride or another material which may be selectively etched relative to the masking layer 42. The nitride layer 56 is then etched back level with the surface of the masking layer 41, preferably by chemical mechanical polishing to provide a fully planarized surface 58 to the masking layer 42 with a nitride plug 56 defined therein in the emitter region (FIG. 7). Thus the masking layer 41 forms a chemical mechanical polish resistant layer which acts as a polish stop layer in this step. The resulting plug 56 has an elongate wedge shaped form (FIG. 7A) narrowing towards the area 50 which will eventually define the emitter-base junction area, and widening towards its upper surface 55.

Figure 8:
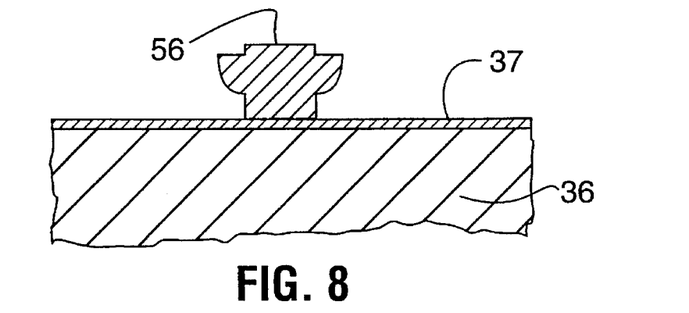
Figure 9:
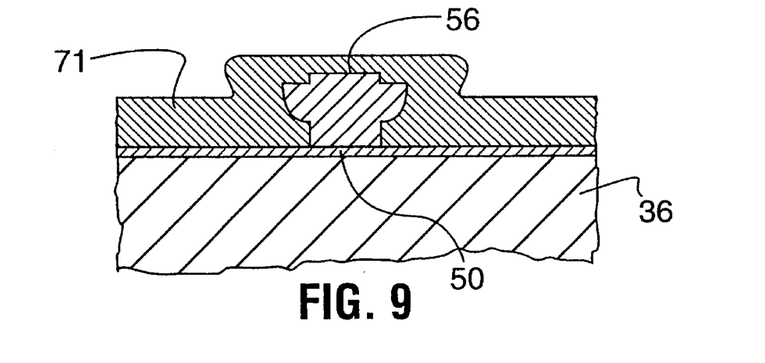

The oxide masking layer 42 and masking layer 41 are then selectively removed from the silicon surface, by a known etch process selective to oxide relative to nitride, leaving the tapered nitride plug 56 on a pedestal extending above the surface 37 of the substrate silicon 36 (Figure 8).

Figure 10:
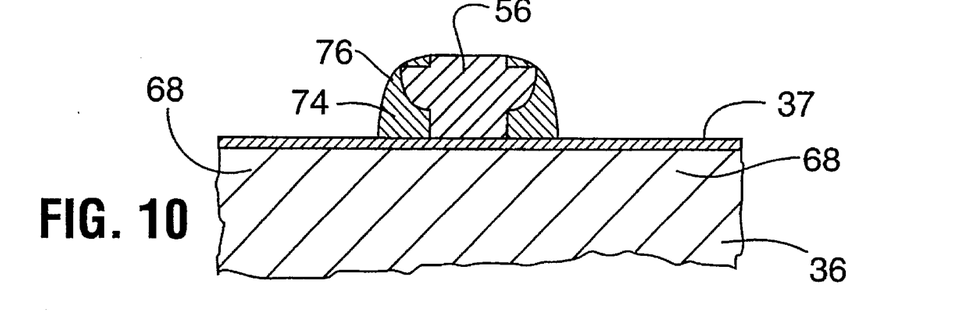
Figure 11:
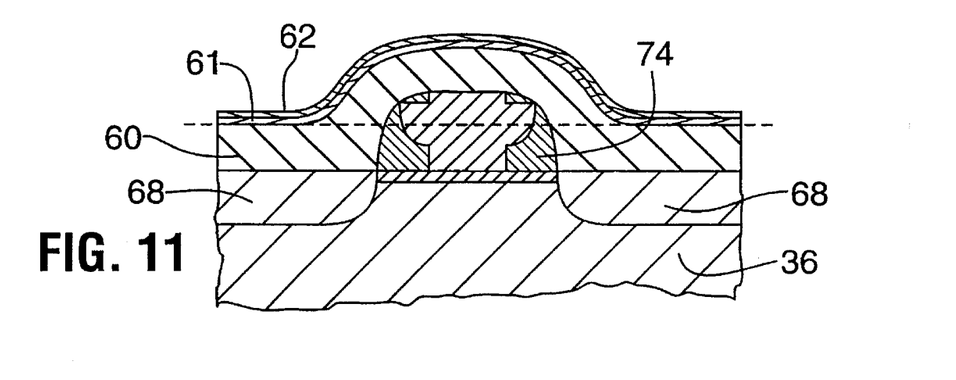
Figure 12:
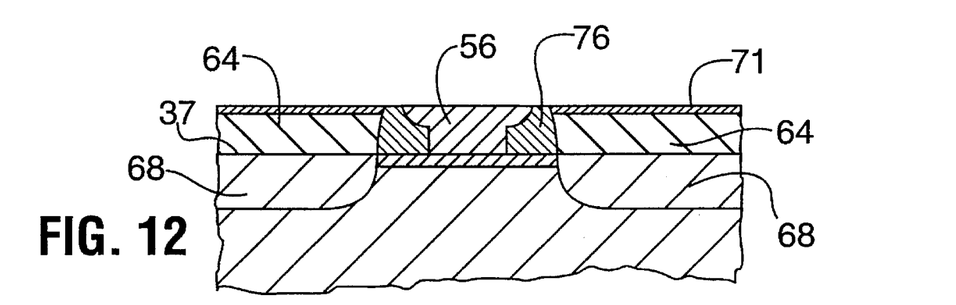

A layer of dielectric 71, e.g. a layer of CVD oxide, is deposited overall (FIG. 9), and then anisotropically etched back, to form sidewall spacers 74 on sidewalls 76 of the nitride plug 56, as shown in FIG. 8, and then anisotropically etched to leave sidewall spacers 74 on sidewalls 76 of the nitride plug (FIG. 10). Then a conductive layer 60, i.e. a first polysilicon layer, is then deposited overall. The polysilicon layer 60 covers the extrinsic base contact regions 37 of the silicon substrate surface and the surfaces of the sidewall spacers 74 and the nitride plug 56 (FIG. 11). The first polysilicon layer is preferably heavily in situ doped to form a conductive layer. A thin oxide layer is then formed on the polysilicon layer 60, followed by a thin nitride layer 62. Dopant is diffused from the polysilicon layer into the extrinsic base regions 68 (FIG. 11). The first polysilicon layer is then etched back and planarized, level with the top surface of the nitride plug (FIG. 12). Etching back is preferably performed by chemical mechanical polishing to provide a fully planarized surface 66, the remaining portions 64 of the first polysilicon layer 60 thereby forming extrinsic base contacts to the substrate surface 37 in the extrinsic base region 68. The exposed, planarized surfaces of the polysilicon portions 64 are oxidized to provide a thin oxide layer 71.

The extrinsic base region 68 may be formed by diffusion of dopant from a heavily doped polysilicon layer 82 as mentioned above. Alternatively, before depositing the polysilicon layer 82, a conventional extrinsic P+implant may be performed to form base contact regions, followed by an anneal to repair implant damage.

Figure 13:
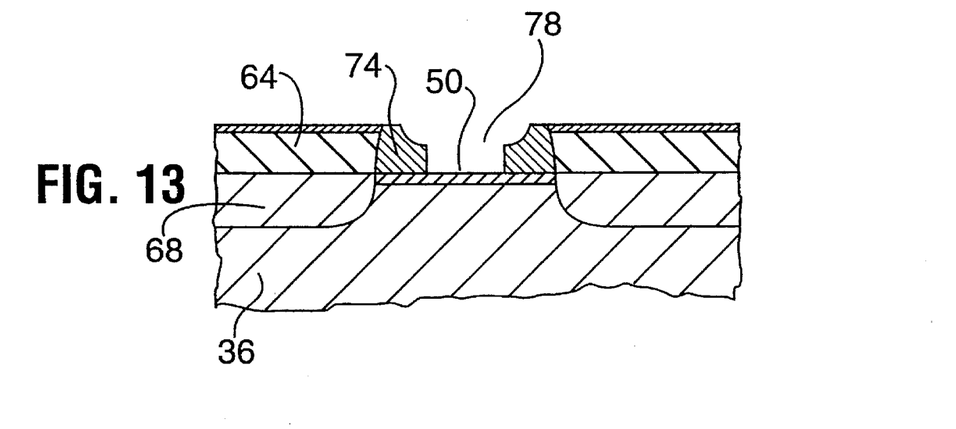

The nitride plug 56 is then selectively removed, by a known nitride selective etch process, leaving the dielectric sidewall spacers 74 on the sides of polysilicon electrodes 64 (FIG. 13). Thus the sidewall spacers define the emitter opening 78 and expose surface 50 of the intrinsic base region 54 of the substrate. A thin layer of oxide 71 remains on the surface of the polysilicon layer which forms the base contacts 64, to ensure polysilicon 64 does not short to the emitter electrode once this is formed.

Figure 14:
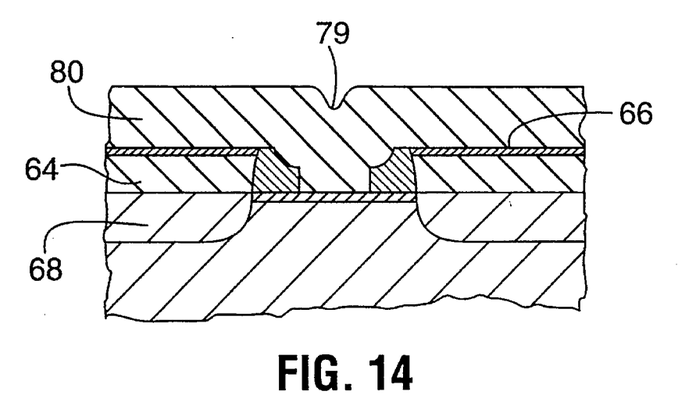
Figure 15:
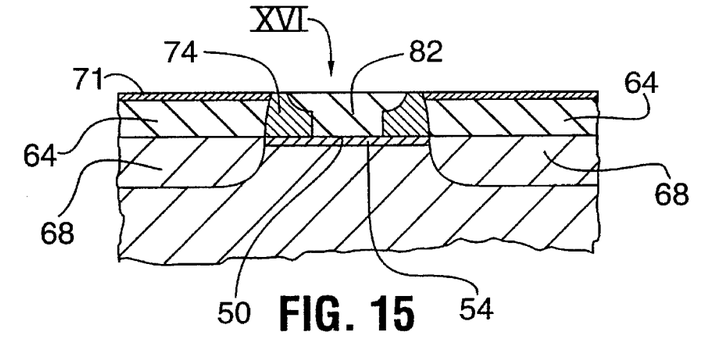
Figure 16:
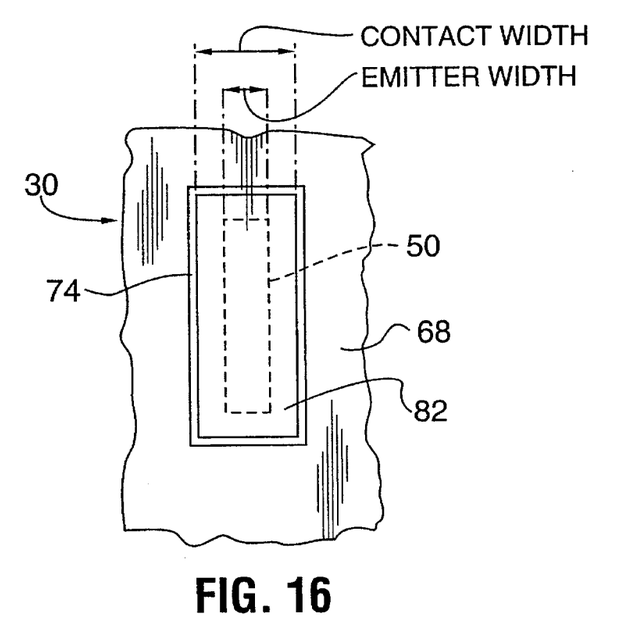
FIG. 16 shows a top view of the structure along arrow XVI in FIG. 15.

Subsequently, a layer 80 of an emitter material is provided within the emitter opening, for example, heavily doped polysilicon formed by a conventional method (FIG. 14). That is, the polysilicon layer 80 forming the emitter is either in-situ doped or deposited undoped and subsequently doped by ion implantation and annealing. Preferably, the emitter layer 80 is formed immediately after cleaning the exposed silicon surface 50 to remove any native oxide formed thereon, so as to ensure a good contact between the emitter layer 80 and the intrinsic base region of the underlying silicon surface 50. When the layer of polysilicon 80 is deposited overall by a conventional method of CVD, the layer must be thick enough to completely fill the emitter opening 78 so that the depression 79 growing surface of the polysilicon layer within the opening is above the planarized surface 66 of the polysilicon electrodes 64 (FIG. 14). The polysilicon layer 80 is then etched back and planarized, preferably by chemical mechanical polishing to provide a fully planarized surface as shown in FIG. 15. Thus, an emitter structure 82 of polysilicon remains in the emitter opening 78 forming an emitter base junction 50, and, isolated from the polysilicon base contacts by the dielectric sidewall spacers 74. The structure is fully planar. Furthermore, the tapered emitter structure 82 allows for a surface contact area substantially larger than the emitter-base junction area 50. For example, a bipolar transistor with a sub-half-micron emitter base junction width may be provided with an emitter contact width exceeding 1 micron. Thus, constraints on emitter contact placement in subsequent metallization steps are eased, but an emitter base-junction with a narrow width is provided Formation of the emitter structure 82 by deposition of a layer 80 of polysilicon by CVD and etching back also provides for running of the polysilicon layer 80 outside the device region over the field oxide, if required, for forming other device structures in the integrated circuit. Alternatively, a polysilicon emitter may be formed by selective epitaxial growth, in which polysilicon 60 grown selectively only in the emitter opening 44.

When the emitter layer 80 is not heavily doped in situ during deposition, after filling the emitter opening 78 by formation of the emitter polysilicon structure ("emitter stripe") 82, implantation of the emitter stripe 82 with a high dose of n-type dopant, e.g. As, is performed. The emitter structure 82 should be thick enough to allow the implant to be performed without penetration of the implant ions through the polysilicon layer into the underlying base region 37, and so that the emitter structure 82 is thick enough to sustain any loss during subsequent processing, such as salicidation of the surface region for contact formation.

Alternatively the emitter may be formed from CVD polysilicon with in situ doping, followed by annealing to diffuse N dopant into the emitter contact region to form the emitter base junction. The thickness of the polysilicon layer 80 forming the emitter structure is determined by the thickness of the masking layer 42. The emitter must be sufficiently thick to provide high gain, that is, so that the emitter functions as an excellent sink for back injected holes.

In fabricating BiCMOS structures, the steps for side wall spacer (SWS) formation, polysilicon deposition, implantation and annealing may be combined with appropriate CMOS steps to reduce total process complexity.

Subsequent "back end" processing steps for providing contact metallization to the base and emitter electrodes comprise conventional known processes, for example the metallization seeps commonly used in multilevel metal CMOS process.

Provision of an emitter by selective epitaxial regrowth (SEG) of polysilicon is advantageous in allowing for growth of polysilicon selectively within the emitter opening. Thus removal of excess polysilicon by chemical mechanical polishing or another etch back process is avoided.

Alternatively, a diffused emitter-base junction formed within the opening may be provided by deposition respectively of doped layers of polysilicon to form base and emitter layers, followed by annealing to diffuse dopants.

The sidewall spacer may alternatively be formed from another dielectric material e.g. BPSG, or tantalum oxide.

The method may also be adapted for forming silicon heterojunction bipolar transistors SiHBTs using alternative base and emitter materials, for example, high band gap emitter materials, such as SiC. Alternative base materials include for example, SiGe.

The process of the embodiment provides top emitter contact area which is planar and significantly larger than the emitter-base junction area. The process avoids many of the manufacturability problems associated with highly nonplanar topography of conventional known double-polysilicon processes. More particularly, the process avoids nonselective etching of polysilicon with respect to a silicon substrate and consequent etch damage to the substrate.

The requirement for photoengraving steps is reduced because one primary mask can provide all patterning for forming an emitter structure.

Clearly, while the embodiment describes a process for formation of a NPN bipolar transistor, a PNP bipolar transistor structure could be provided by a complementary process to provide elements of opposite conductivity type, if required.

The process of the embodiment may also be adapted for formation of polysilicon gate structures for MOS transistors, i.e. by using the reverse masking scheme to form a tapered gate electrode structure on a gate dielectric, isolating gate electrode from underlying channel region. This method provides a practical game electrode contact area even with a gate width of ≦0.5 μm.

Figure 17:
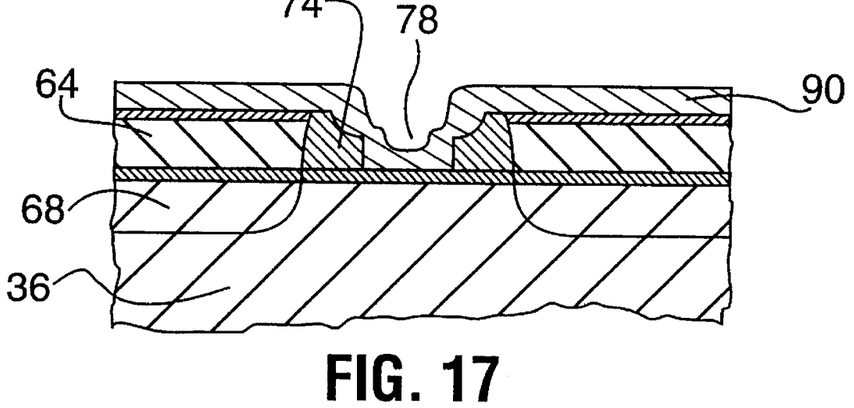
Figure 18:
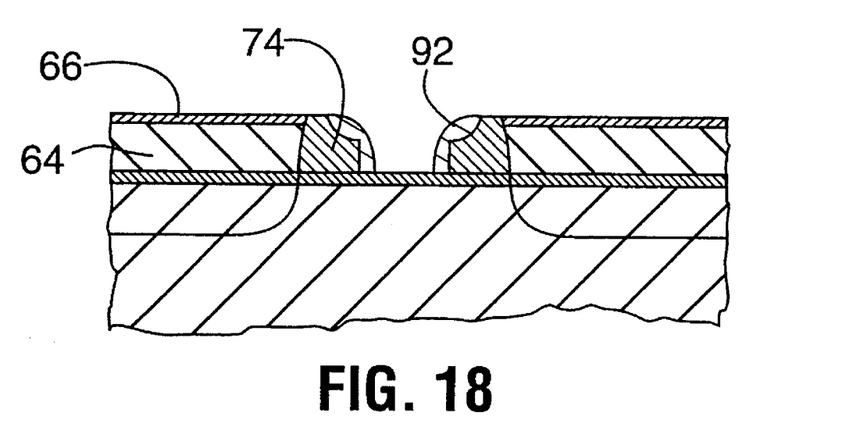
Figure 19:
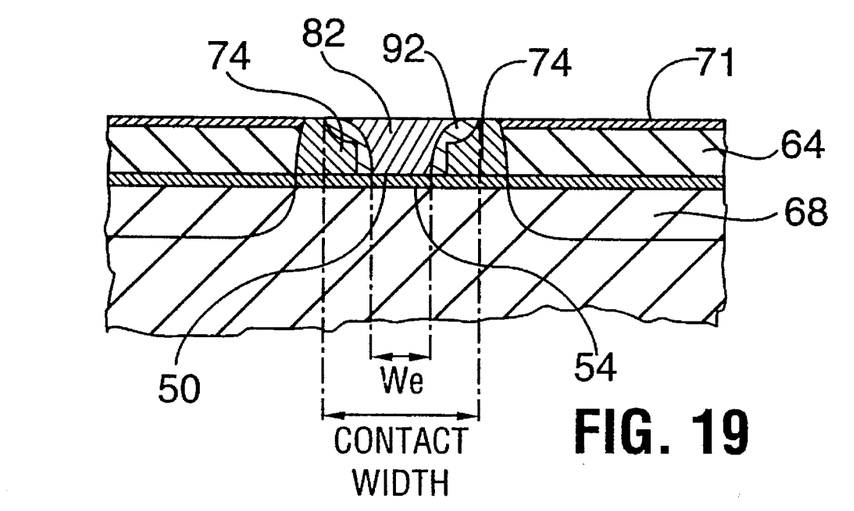

In a method of fabricating a bipolar transistor according to a second embodiment, the method proceeds as in the first embodiment, up to the step of forming the emitter opening 78 by removal of the nitride plug 56 as shown in FIG. 13. Then, as shown in FIGS. 17 to 19, a dielectric layer 90 is deposited overall and then aniostropicaly etched to leave sidewall spacers 92 within the emitter opening. Thus, the width of the opening is further reduced before formation of the emitter structure 82 to form an even narrower emitter base junction.

In a method of fabricating a bipolar transistor according to a third embodiment of the present invention, the method is similar to that of the first embodiment, up to the step of forming the tapered nitride plug as shown in FIG. 8. The first conductive layer is deposited immediately after forming the tapered nitride plug and then planarized. After removing the plug from the conductive layer to define a tapered opening, dielectric sidewall spacers are formed on the sides of the first conductive layer defining the emitter opening. The second conductive layer is then deposited to form the emitter structure. This method reduces the number of process steps. In practice, it is necessary to control carefully the formation of the sidewall spacers directly on the tapered side walls of the base electrodes to ensure isolation of the base and emitter structure.

Although particular embodiments of the invention have been described in detail, it should be appreciated that numerous modifications, and variations may be made without departing from the scope of the invention as defined in the claims.

What is claimed is:

1. A method of forming a transistor for an integrated circuit, comprising:

providing a semiconductor substrate for an integrated circuit having a surface with a device well region of a first conductivity type defined therein;

providing a tapered body of a first dielectric material masking a selected region of the substrate surface, the tapered body having sidewalls tapering outwardly from the selected region on the substrate towards a top surface of the tapered body;

providing a layer of an other dielectric material forming sidewall spacers on sidewalls of the tapered body;

providing a layer of a first conductive material over regions of the substrate adjacent the tapered body, said layer having a surface coplanar with the top surface of the tapered body, to form first contact electrodes with the underlying substrate surface;

selectively removing the tapered body of the first dielectric material from the substrate thereby exposing sidewall spacers of the other dielectric material to define a tapered opening exposing said selected region of the substrate within the opening;

forming a second contact electrode by providing a layer of a second conductive material within the tapered opening, isolated from the first conductive layer by the dielectric sidewall spacers;

planarizing the resulting structure to form a fully planarized surface providing coplanar contact areas on the first and second contact electrodes.

2. A method according to claim 1 wherein providing a tapered body of a dielectric material masking a selected region of the substrate surface comprising:

providing a masking layer of a first dielectric material on the surface of the substrate;

patterning and etching the masking layer to define a tapered opening through the masking layer exposing the selected region of the substrate surface within a bottom of the tapered opening;

providing a body of a second dielectric material filling the tapered opening to a level coplanar with a surrounding surface of the masking layer;

selectively removing the masking layer whereby the body of the second dielectric material provides the tapered body masking the selected region of the substrate surface.

3. A method according to claim 2 wherein providing a body of a second dielectric material filling the tapered opening to a level coplanar with a surrounding surface of the masking layer comprises depositing a layer of a second dielectric material overall and planarizing the resulting structure by etching back the second dielectric material coplanar with a surface of the first dielectric layer by chemical mechanical polishing.

4. A method according to claim 1 wherein providing a layer of a first conductive material over exposed regions of the substrate adjacent the tapered body to form contact electrodes with the underlying substrate surface comprises providing a conformal layer of a first conductive material overall, including over sidewalls of the tapered body, and then etching back the first conductive layer to a level coplanar with the top surface of the tapered body by chemical mechanical polishing.

5. A method according to claim 1 wherein planarizing the resulting structure to form a fully planarized surface providing coplanar contact areas on the first conductive layer and second conductive layer comprises chemical mechanical polishing.

6. A method of forming a bipolar transistor for an integrated circuit, comprising:

providing a semiconductor substrate for an integrated circuit comprising a surface having defined therein a device well region of a first conductivity type;

providing a masking layer of a dielectric material overall;

patterning and etching the masking layer to define a tapered opening therethrough exposing a selected region of the substrate within a bottom of the tapered opening, said selected region defining a base-emitter junction area of the bipolar transistor;

providing a tapered body of a second dielectric material by filling the tapered opening coplanar with a surrounding surface of the masking layer;

selectively removing the masking layer, leaving exposed tapered sidewalls of the body of the second dielectric material, the tapered body of the second dielectric material thereby masking the selected region of the substrate;

providing a layer of a first conductive material over exposed regions of the substrate adjacent the tapered sidewalls of the dielectric body to form base contact electrodes with the underlying substrate;

selectively removing the tapered body of the second dielectric and exposing sidewalls of the first conductive layer to define a tapered emitter opening therein;

providing a dielectric isolation layer comprising sidewall spacers on exposed sidewalls of the first conductive layer;

forming an intrinsic base region of a second conductivity type within the opening;

forming an emitter structure within the emitter opening comprising of a layer of an emitter material of the first conductivity type filling the opening in the first conductive layer to a level coplanar with the planarized surface of the first conductive layer, the emitter material being isolated from the first conductive layer by the sidewall spacers and forming a base-emitter junction with the underlying base region within the opening.

7. A method according to claim 6 wherein providing a body of a second dielectric material filling the tapered opening to a level coplanar with a surrounding surface of the masking layer comprises depositing a layer of a second dielectric material overall and planarizing the resulting structure by etching back the second dielectric material to a level coplanar with a surface of the first dielectric layer by chemical mechanical polishing.

8. A method according to claim 6 wherein providing a layer of a first conductive material over exposed regions of the substrate adjacent the tapered body to form contact electrodes with the underlying substrate surface comprises providing a conformal layer of a first conductive material overall and then etching back the first conductive layer to a level coplanar with the top surface of the tapered body by chemical mechanical polishing.

9. A method according to claim 6 comprising a subsequent step of planarizing the resulting structure by chemical mechanical polishing to form a fully planarized surface providing coplanar contact areas to the base contact electrodes and to the emitter structure.

10. A method according to claim 6 wherein providing an masking layer comprises depositing a layer of low density silicon dioxide and providing the second dielectric layer comprises depositing a layer of silicon nitride.

11. A method according to claim 6 wherein providing a layer of a first conductive material comprises depositing a layer of polysilicon overall, including over sidewalls of the tapered dielectric body and then etching back and planarizing the first conductive layer by chemical mechanical polishing to form a fully planarized surface thereby exposing a top surface of the tapered dielectric body.

12. A method according to claim 6 wherein providing the emitter structure comprises:

depositing a layer of polysilicon overall; and then etching back and planarizing emitter material extending above the planar surface of the first conductive layer by a step of chemical mechanical polishing to form a fully planarized surface providing coplanar contact areas to the base contact electrodes and to the emitter structure.

13. A method according to claim 6 comprising forming a self aligned base region within the emitter opening comprising forming a heavily doped surface layer of a second conductivity type within the emitter opening by ion implantation with low energy ions.

14. A method according to claim 6 wherein providing a layer of an emitter material of the first conductivity type comprises providing a layer of heavily doped polysilicon in the emitter opening.

15. A method according to claim 14 comprising depositing a layer of polysilicon overall, etching back the polysilicon layer from the masking layer to leave polysilicon emitter structure in the emitter opening, and heavily doping the polysilicon emitter structure by ion implantation.

16. A method according to claim 14 comprising providing an emitter material comprising by selective epitaxial growth within the emitter opening.

17. A method according to claim 6 wherein the first conductive material and the emitter material comprise polysilicon.

* * * * *